(12) United States Patent
Iacovangelo

(10) Patent No.: US 6,379,757 B1
(45) Date of Patent: Apr. 30, 2002

(54) SILICON DIOXIDE DEPOSITION BY PLASMA ACTIVATED EVAPORATION PROCESS

(75) Inventor: Charles Dominic Iacovangelo, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/354,258

(22) Filed: Jul. 15, 1999

Related U.S. Application Data

(63) Continuation of application No. 09/059,109, filed on Apr. 13, 1998, now abandoned.
(60) Provisional application No. 60/050,820, filed on Jun. 26, 1997.

(51) Int. Cl.⁷ .................................................. H05H 1/24
(52) U.S. Cl. ........................ 427/576; 427/579; 427/597; 427/551
(58) Field of Search ................................ 427/567, 574, 427/578, 579, 551, 576, 597

(56) References Cited

U.S. PATENT DOCUMENTS

| 3,522,080 A |   | 7/1970  | Dietzel et al. |
| 4,200,681 A |   | 4/1980  | Hall et al. |
| 4,514,437 A | * | 4/1985  | Nath ............................ 427/39 |
| 4,771,015 A |   | 9/1988  | Kanai et al. |
| 4,842,941 A |   | 6/1989  | Devins et al. |
| 4,927,704 A | * | 5/1990  | Reed et al. ............. 427/255.37 |
| 5,156,882 A | * | 10/1992 | Rzad et al. ................. 427/569 |
| 5,436,035 A |   | 7/1995  | Lohwasser |
| 5,445,871 A |   | 8/1995  | Murase et al. |
| 5,597,622 A | * | 1/1997  | Zoller et al. ................. 427/563 |
| 5,614,248 A | * | 3/1997  | Schiller et al. ................. 427/8 |
| 5,635,087 A |   | 6/1997  | Schiller et al. |
| 5,897,925 A | * | 4/1999  | Huang et al. ............... 427/579 |

FOREIGN PATENT DOCUMENTS

| DE | 19612345 |   | 1/1997 |
| DE | 19548160 | * | 5/1997 |
| WO | 9409176  |   | 4/1994 |

OTHER PUBLICATIONS

Tsuruoka et al., Y–Ba–Cu–O Film Growth by OMCVD Using $N_2O$ Japanese J. Appl. Phys. L1800–L1802 (1989).

* cited by examiner

*Primary Examiner*—Bret Chen
(74) *Attorney, Agent, or Firm*—Robert P. Santandrea; Noreen C. Johnson

(57) ABSTRACT

A method for coating a plastic substrate with an abrasion resistant metal oxide layer which includes placing the plastic substrate in a vacuum chamber, forming a vacuum in the chamber, conducting electron beam evaporation of an oxide-forming metal or a metal oxide in the vacuum chamber, passing the evaporated metal or metal oxide into an argon plasma into which oxygen and nitrous oxide has been passed, and, exposing the plastic substrate to the plasma, whereby the abrasion resistant layer is deposited on an exposed surface of the substrate.

6 Claims, 2 Drawing Sheets

SILICON DIOXIDE DEPOSITION BY PLASMA ACTIVATED EVAPORATION PROCESS

This application is a continuation of application Ser. No. 09/059,109, filed Apr. 13, 1998, now abandoned which is hereby incorporated by reference in its entirety. This application claims the benefit of U.S. Provisional Application No. 60/050,820, filed Jun. 26, 1997.

BACKGROUND OF THE INVENTION

This invention relates to deposition of thin stable, adherent abrasion resistant films or coatings on various surfaces, particularly plastic surfaces and to articles having such coatings.

Engineering resins are well-known, commercially available materials possessing physical and chemical properties which are useful in a wide variety of applications. For example, polycarbonates, because of their excellent breakage resistance, have replaced glass in many products, such as automobile headlamps and stoplight lenses; safety shields in windows, architectural glazing, and the like. However, major defects exhibited by polycarbonates are their very low scratch-resistance and their susceptibility to ultraviolet light-induced degradation.

Several techniques for depositing silicon films are commonly employed such as chemical vapor deposition (CVD), physical vapor deposition(PVD), electron beam epitaxy and plasma enhanced chemical vapor deposition (PECVD) and plasma polymerization (PP). The choice of process is often dictated by the substrate to be coated especially the thermal stability of the substrate which limits the temperature to which it can be exposed. A primary goal is to deposit hard, wear resistant, silicon films on plastic for a variety of applications such as optical glass, architectural windows, automobile windows, and the like. Key to production of such products is the development of high rate low cost processes that can deposit a high quality oxide film on the surface, particularly on plastic surfaces. Physical vapor deposition techniques such as sputtering can yield good quality coatings but at low rates which are not cost effective. High temperature chemical vapor deposition techniques can yield high rates but at temperatures that exceed the temperature limit of the substrate.

SUMMARY OF THE INVENTION

Figure 1:
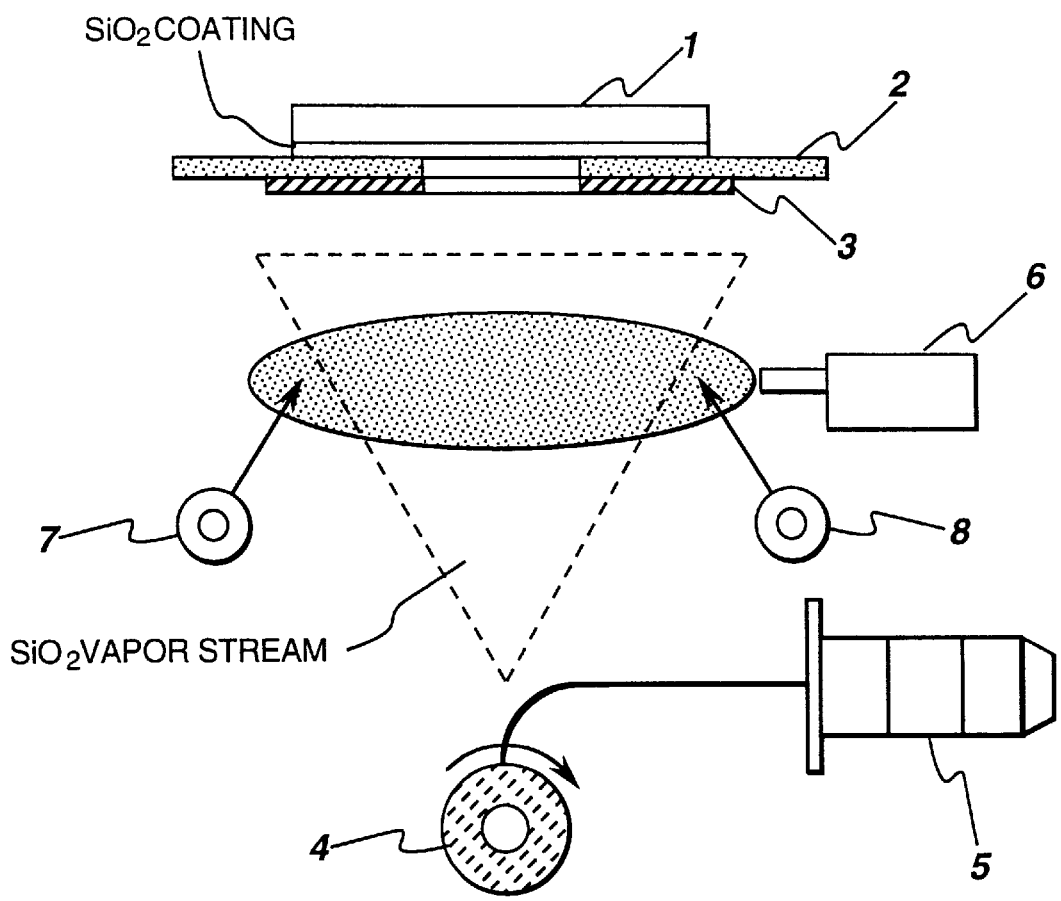
FIG. 1 is schematic illustration of an apparatus for coating sheet material by the method of this invention.

Plasma activated reactive evaporation (ARE) is a process which has been found to be suitable for deposition on low temperature substrates such as plastics as well as on high temperature materials such as ceramics and glass. This process uses an electron-beam to evaporate silica or silicon at high rates in the presence of nitrous oxide, an organosilicon, and an argon plasma to nucleate and deposit dense films without exceeding the temperature capability of the plastic. An additional oxygen inlet can be used to provide oxygen in the case of non-oxide elemental evaporation, and as make up oxygen when evaporating an oxide.

DESCRIPTION OF THE INVENTION

This invention provides a method for deposition of a hard, stable, adherent, and abrasion resistant coating of silicon, carbon, and oxygen on a substrate, e.g. a polycarbonate surface or a polycarbonate surface which has been previously coated with a silicone hard coat by any conventional means for depositing hard coats such as dipping or rolling. A standard electron-beam is used to evaporate silica onto a plastic surface placed above the evaporating silica in an evacuated chamber. Multiple hollow cathode plasma sources are placed just below the substrate so that the evaporating material and the substrate surface are exposed to the plasma. A nitrous oxide gas flow is introduced just below the plasma source so that the gas passes through the plasma to the surface being coated. The presence of the nitrous oxide was unexpectedly found to improve the stability of the coating and alter the stress in the coating. An organosilicon is also introduced just below the plasma source so that it passes through the plasma. The presence of an organosilicon was found to improve the ductility (as measured by % strain to micro-cracking) and the Taber abrasion resistance of the coating.

Organosilicon modified oxide layers or thin films having improved flexibility, which are resistant to cracking, delamination, and abrasion can be deposited on substrate surfaces by a process which combines features of physical and chemical vapor deposition techniques in the presence of a plasma. A small amount of at least one suitable organic monomer improves the properties of the film. The reactive gas and the monomers together with the vaporized oxide-forming element, such as an elemental metal like titanium, aluminum, or silicon or a metal oxide such as silicon dioxide are supplied to the reaction chamber so that they pass through a high density plasma before contacting the substrate surface on which the film is to be deposited. Passing the reactive gas, the oxide precursor, and the monomer through the plasma prior to impingement on the surface improves the layer structure and its properties.

Silicon-containing reactive monomers include silane, disilane, or organosilicon compounds such as tetramethyldisiloxane (TMDSO), hexamethyldisiloxane (HMDSO), tetraethyl orthosilicate, hexamethyldisilane, octamethylcyclotetrasiloxane (D4), and tetramethylcyclotetrasiloxane.

DESCRIPTION OF THE DRAWINGS

FIG. 1 shows a preferred embodiment of the invention in which the substrate 1 is a plastic sheet which is placed on top of the moving palette 2. The sheet is located over the window in the palette so that as it translates over the window in the cooling cover 3. It is exposed to the plasma, gases, and evaporating material. Silica is evaporated from a rotating drum 4 by striking the surface with an electron beam gun 5 that translates along the length of the drum as the drum rotates. The beam is magnetically deflected as routinely practiced. Multiple hollow cathode plasma sources 6 are located just below the translating sheet and are magnetically focused (not shown) to spread the beam for uniform plasma density along the width of the sheet. Reactant gases such as nitrous oxide, an organosilicon and/or oxygen are feed into the chamber through 2 gas manifolds 7 and 8 located on either side of the window and below the plasma so that the gases pass through the plasma and react with the evaporating materials. Typically, the chamber is pumped down to a set pressure to remove residual moisture from the chamber. The pressure is then increased via the argon supply to the hollow cathodes and the oxidant feed. After adjustment of the silica evaporation rate and obtaining a stable plasma density, the shutter covering the opening (window) in the cooling plate is opened. The speed of the palette 2 containing the plastic sheet to be coated is then set to achieve the desired thickness based on the evaporation rate.

Deposits were made on 18 cm×36 cm×3 mm polycarbonate sheet with and without a silicon hardcoat. The nitrous oxide and oxygen flow rates were adjusted from 0 to 4 l/min with equal flows to the two gas manifolds. Organosilicon flow rates were adjusted from 0–4 grams/minute. The hollow cathode plasma were adjusted from 0 to 200 amps. The pressure during deposition ranged from 0.1 to 0.7 Pa depending on the gas flow rates. Deposition time was adjusted to achieve a target thickness range of 2 to 4 microns.

Figure 2:
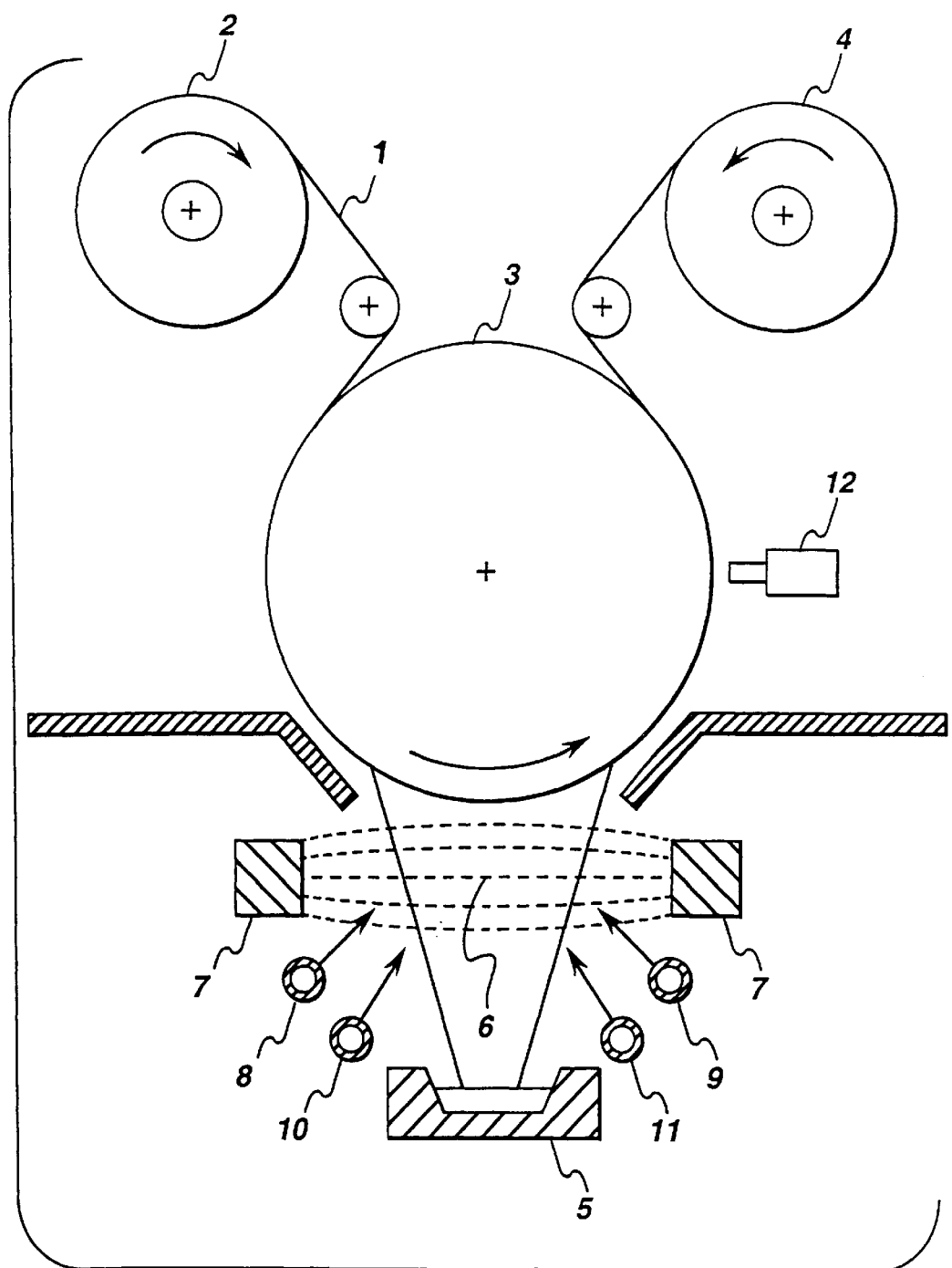
FIG. 2 is a schematic view of an apparatus for coating flexible film.

FIG. 2 shows another embodiment of the invention. The substrate 1 is a plastic film which runs from pay-out reel 2 to take-up reel 4 via cooling drum 3. Silica is evaporated from a series of resistance heated boat evaporators 5 arranged at the bottom of the cooling drum 3. A pair of magnetrons 7 in front of the substrate are used to generate the high density plasma. Arranged below the plasma zone are nozzles 8,9,10, and 11 for the introduction of nitrous oxide and other reactive or plasma gases. Nozzles are directed towards the surface to be coated.

EXAMPLE

A 18 cm×36 cm×3 mm polycarbonate sheet was coated with silicon dioxide in the following manner. Nitrous oxide was fed at 2 l/min through each of the two feed lines for a total flow of 4 l/min. The chamber was pumped down to 0.21 Pa prior to deposition then raised to 0.7 Pa during deposition. Silicon was evaporated using a e-beam current of 0.32 A which gave a deposition rate of about 250 nm/sec. The sheet passed over the evaporation source on a moving palette with a speed of about 1 cm/sec to achieve a deposit thickness of 4 microns. The hollow cathode current was set at 200 A. The plasma color was very light compared to the standard deep purple argon plasma. The coating was very clear and well adhered to the polycarbonate sheet substrate. Visual inspection after several weeks showed no change in appearance, adhesion, flaking, or obvious reaction with air.

Examples 6, 7 were run in an analogous fashion with variations in flow rate and plasma current as noted in Table 1. Good results were obtained with low plasma or no plasma showing the main benefit of this process. An added benefit of this process is that the stress of the coating could be adjusted from tensile to compressive stressed by controlling the feed rate of the nitrous oxide.

Comparative examples 2–5 were run in an analogous fashion with variation in the type of gas feed and the plasma current as shown in Table 1. As shown, by comparison without a oxidant gas feed reactivity with the air caused flaking of the coating independent of the level of plasma activation. Using oxygen at high plasma activation and high flow rate did result in a non-reactive coating but the operating window was not sufficient since any lowering of the feed rate or plasma current resulted in flaking of the coating.

TABLE 1

Silicon Dioxide Coating By ARE

| Example | Plasma (amps) | Gas-Flow (l/m) | Stress | Description of results |
|---|---|---|---|---|
| 1 | 2x200 | $N_2O$ 2x2 | T | clear, no flaking, well adhered |
| 2 | 2x200 | — | C | flaking within minutes |
| 3 | 2x200 | $O_2$ 2x1 | T | clear, no flaking, poor adhesion |
| 4 | 2x200 | $O_2$ 2x0.5 | T | flaking within minutes |
| 5 | — | $O_2$ 2x1 | — | flaking within minutes |
| 6 | — | $N_2O$ 2X2 | T | clear, no flaking, well adhered |
| 7 | 2x125 | $N_2O$ 2x1 | C | clear, no flaking, well adhered |

T = tensile stress
C = compressive stress

Examples 2–4 in Table 2 were run in an analogous fashion with variation in organosilicon flow rate and plasma showing a second benefit of this process. The principle benefit of this process is that the incorporation of an organosilicon increases the ductility and abrasion resistance of the coating by using a combined CVD and PVD approach to depositing the coating. As shown, by comparison without an organosilicon gas feed, the Taber abrasion ("% Hase") and % strain to cracking were low. Using an organosilicon increased the % strain to cracking and the Taber abrasion, however, above a certain level it caused a decrease in Taber abrasion.

TABLE 2

Silicon Oxygen Carbon Coating By ARE

| Example | HMDSO (g/m) | $N_2O$ Flow (l/m) | % Haze | % strain | % C |
|---|---|---|---|---|---|
| 1 | 0 | 2x2 | 18 | 0.8 | 0 |
| 2 | 1 | 2x2 | 12 | 1.2 | 2 |
| 3 | 2 | 2x2 | 4 | 1.5 | 6 |
| 4 | 4 | 2x2 | 13 | 1.9 | 12 |

What is claimed is:

1. A method for coating a plastic substrate with an abrasion resistant metal oxide layer which comprises: placing the plastic substrate in a vacuum chamber, conducting electron beam evaporation of an oxide-forming metal or a metal oxide in the vacuum chamber, passing the oxide-forming metal into an argon plasma into which nitrous oxide has been passed, and exposing the plastic substrate to the plasma, whereby the abrasion resistant layer is deposited on an exposed surface of the substrate.

2. A method according to claim 1 in which the oxide-forming metal is silicon, titanium, or aluminum.

3. A method according to claim 1 in which the plastic substrate comprises a polycarbonate.

4. A method according to claim 1 in which the oxide evaporated into the plasma comprises silica.

5. The method according to claim 1, wherein the plastic substrate is polycarbonate and the metal oxide is silica.

6. The method according to claim 1, further comprising passing oxygen into the argon plasma.

* * * * *